United States Patent
Zhang et al.

(10) Patent No.: US 10,510,683 B2
(45) Date of Patent: Dec. 17, 2019

(54) PACKAGING STRUCTURES FOR METALLIC BONDING BASED OPTO-ELECTRONIC DEVICE AND MANUFACTURING METHODS THEREOF

(71) Applicants: Tsinghua University, Haidian District, Beijing (CN); NUCTECH COMPANY LIMITED, Haidian District, Beijing (CN)

(72) Inventors: Wenjian Zhang, Beijing (CN); Qingjun Zhang, Beijing (CN); Yuanjing Li, Beijing (CN); Zhiqiang Chen, Beijing (CN); Ziran Zhao, Beijing (CN); Yinong Liu, Beijing (CN); Yaohong Liu, Beijing (CN); Xiang Zou, Beijing (CN); Huishao He, Beijing (CN); Shuwei Li, Beijing (CN); Nan Bai, Beijing (CN)

(73) Assignees: Tsinghua University, Haidian District, Beijing (CN); NUCTECH COMPANY LIMITED, Haidian District, Beijing (CN)

( * ) Notice: Subject to any disclaimer, the term of this patent is extended or adjusted under 35 U.S.C. 154(b) by 0 days.

(21) Appl. No.: 15/718,919

(22) Filed: Sep. 28, 2017

(65) Prior Publication Data
US 2018/0158785 A1  Jun. 7, 2018

(30) Foreign Application Priority Data
Dec. 7, 2016  (CN) .......................... 2016 1 1120663

(51) Int. Cl.
*H01L 25/00*  (2006.01)
*H01L 23/00*  (2006.01)
(Continued)

(52) U.S. Cl.
CPC ............ *H01L 23/562* (2013.01); *H01L 23/15* (2013.01); *H01L 23/49827* (2013.01);
(Continued)

(58) Field of Classification Search
CPC ............................... H01L 24/01; H01L 25/50
(Continued)

(56) References Cited

U.S. PATENT DOCUMENTS 6,784,554 B2 *  8/2004  Kajiwara ................ H01L 24/02
257/690
2013/0026376 A1 *  1/2013  Tokura .................. G01T 1/2018
250/366

FOREIGN PATENT DOCUMENTS

CN       102844680 A     12/2012
CN       103296036 A      9/2013
(Continued)

*Primary Examiner* — Mark V Prenty
(74) *Attorney, Agent, or Firm* — Merchant & Gould P.C.

(57) ABSTRACT

The present disclosure proposes a packaging structure for a metallic bonding based opto-electronic device and a manufacturing method thereof. According to the embodiments, the packaging structure for an opto-electronic device may comprise an opto-electronic chip and a packaging base. The opto-electronic chip comprises: a substrate having a first substrate surface and a second substrate surface opposite to each other; an opto-electronic device formed on the substrate; and electrodes for the opto-electronic device which are formed on the first substrate surface. The packaging base has a first base surface and a second base surface opposite to each other, and comprises conductive channels extending from the first base surface to the second base surface. The opto-electronic chip is stacked on the packaging base in such a manner that the first substrate surface faces the packaging base, and the electrodes formed on the first substrate surface
(Continued)

of the opto-electronic chip are bonded with corresponding conductive channels in the packaging base.

6 Claims, 2 Drawing Sheets

(51) Int. Cl.
*H01L 31/024* (2014.01)
*H01L 31/18* (2006.01)
*H01L 23/15* (2006.01)
*H01L 23/498* (2006.01)
*H01L 31/02* (2006.01)
*H01L 31/0203* (2014.01)
*H01L 27/146* (2006.01)

(52) U.S. Cl.
CPC .............. *H01L 24/13* (2013.01); *H01L 24/16* (2013.01); *H01L 24/81* (2013.01); *H01L 27/146* (2013.01); *H01L 31/0203* (2013.01); *H01L 31/024* (2013.01); *H01L 31/02005* (2013.01); *H01L 31/1804* (2013.01); *H01L 2224/13144* (2013.01); *H01L 2224/13166* (2013.01); *H01L 2224/16235* (2013.01); *H01L 2224/81203* (2013.01); *H01L 2924/10253* (2013.01); *H01L 2924/12043* (2013.01); *H01L 2924/15788* (2013.01); *H01L 2924/3512* (2013.01); *Y02P 70/521* (2015.11)

(58) Field of Classification Search
USPC .......................................................... 257/460
See application file for complete search history.

(56) References Cited

FOREIGN PATENT DOCUMENTS

| | | |
|---|---|---|
| CN | 206259356 U | 6/2017 |
| JP | H07-169875 A | 7/1995 |
| JP | H09-92651 A | 4/1997 |
| JP | 2003-282628 A | 10/2003 |
| JP | 2007-142026 A | 6/2007 |
| JP | 2007-251182 A | 9/2007 |
| JP | 2009-81201 A | 4/2009 |
| JP | 2012-146947 A | 8/2012 |

* cited by examiner

PACKAGING STRUCTURES FOR METALLIC BONDING BASED OPTO-ELECTRONIC DEVICE AND MANUFACTURING METHODS THEREOF

CROSS-REFERENCE TO RELATED APPLICATION(S)

The present application claims priority to the Chinese Patent Application No. 201611120663.2, filed on Dec. 7, 2016, which is incorporated herein by reference in its entirety.

TECHNICAL FIELD

The present disclosure relates to packaging of an opto-electronic device, and more particularly, to a packaging structure for a metallic bonding based opto-electronic device and a manufacturing method thereof.

BACKGROUND

In conventional packaging of a back-type opto-electronic device, solder balls are typically planted over electrodes of a bare die so that the solder balls are welded onto a packaging print circuit board (PCB). In order to improve the reliability, padding material may be filled between the bare die and the packaging PCB. However, this structure is prone to cracking when temperature changes, due to a significant difference of thermal expansion coefficient between material of the conventional packaging PCB and material (Si) of the bare die.

In addition, when packaging is done, the packaged back-type opto-electronic device will be welded onto a corresponding circuit board in a second welding process. If regular soldering is used, in the second welding process, the solder balls planted over the bare die will be melted for a second time. If low temperature soldering is used instead, higher requirements must be applied to the welding process and the solder itself, and failure to meet these requirements will easily cause trouble in welding.

Novel packaging techniques are desired in order to at least partially address the above issues.

SUMMARY

Therefore, the present disclosure aims to at least partly propose a packaging structure for a metallic bonding based opto-electronic device and a manufacturing method thereof.

According to an aspect of the present disclosure, there is provided a packaging structure for an opto-electronic device, comprising: an opto-electronic chip and a packaging base. The opto-electronic chip comprises: a substrate having a first substrate surface and a second substrate surface opposite to each other; an opto-electronic device formed on the substrate; and electrodes for the opto-electronic device which are formed on the first substrate surface. The packaging base has a first base surface and a second base surface opposite to each other, and comprises conductive channels extending from the first base surface to the second base surface. The opto-electronic chip is stacked with the packaging base in such a manner that the first substrate surface faces the packaging base, and the electrodes formed on the first substrate surface of the opto-electronic chip are bonded with corresponding conductive channels in the packaging base.

According to another aspect of the present disclosure, there is provided a method for packaging an opto-electronic chip. The opto-electronic chip comprises: a substrate having a first substrate surface and a second substrate surface opposite to each other; an opto-electronic device formed on the substrate; and electrodes for the opto-electronic device which are formed on the first substrate surface. The method comprises: providing a packaging base, the packaging base having a first base surface and a second base surface opposite to each other, and comprising conductive channels extending from the first base surface to the second base surface; causing the opto-electronic chip to be stacked on the packaging base in such a manner that the first substrate surface faces the packaging base; and causing the electrodes formed on the first substrate surface of the opto-electronic chip to bond with corresponding conductive channels in the packaging base.

According to the embodiments of the present disclosure, not only difficulties in the packaging process and subsequent utilization can be reduced, but also reliability of the device and photo-electric transformation efficiency can be improved effectively.

BRIEF DESCRIPTION OF THE DRAWINGS

The above and other purposes, features and advantages of the present disclosure would become more apparent by describing the embodiments of the present disclosure below with respect to the drawings, in which.

Through the drawings, the same or like reference signs indicate the same or like components.

DETAILED DESCRIPTION

Hereinafter, the embodiments of the present disclosure will be described with reference to the accompanying drawings. It is to be understood, however, that such description is exemplary only and is not intended to limit the scope of the disclosure. In addition, in the following description, descriptions of well-known structures and techniques are omitted to avoid unnecessarily obscure the concepts of the present disclosure.

Various structural diagrams according to the embodiments of the present disclosure are shown in the accompanying drawings. These figures are not drawn to scale, and for the purpose of clarity, some details are magnified and some details may be omitted. Shape, relative sizes and positional relationships of various regions and layers shown in the figures are merely exemplary and have deviation in practice due to manufacturing tolerances or technical limitations. Those skilled in the art can additionally design regions/layers with different shapes, sizes, and relative positions as required.

In the context of the present disclosure, when a layer/element is referred to as being located "on" another layer/ element, the layer/element may be located directly on the other layer/element, or there may be an intermediate layers/components therebetween. In addition, if one layer/element is located "on" another layer/element in one direction, then the layer/element may be located "below" the other layer/element when the direction is reversed.

Figure 1:
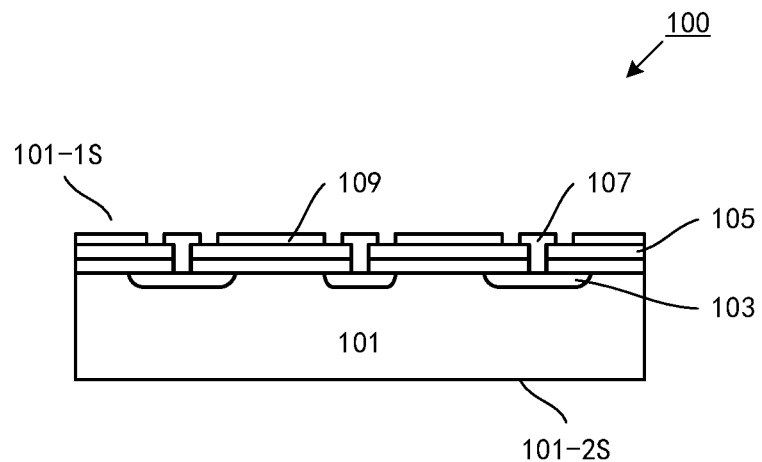
FIG. 1 is a schematic cross-sectional diagram of an opto-electronic chip according to an embodiment of the present disclosure.

FIG. 1 is a schematic cross-sectional diagram of an opto-electronic chip according to an embodiment of the present disclosure.

As shown in FIG. 1, the opto-electronic chip 100 according to the present embodiment is, for example, a bare die which has not been packaged after the opto-electronic device is fabricated on a substrate 101. The substrate 101 may be a semiconductor substrate such as a silicon substrate and includes a first substrate surface 101-1S and a second substrate surface 101-2S opposite to each other. The first substrate surface 101-1S and the second substrate surface 101-2S may be substantially parallel to each other. For example, the opto-electronic device may be fabricated on a silicon wafer through a semiconductor process and the silicon wafer may be sliced. The sliced wafer portion may form the substrate 101 and the fabricated opto-electronic device (and possible peripheral components) is included on the substrate 101. Such opto-electronic device may include corresponding electrode regions 103, for example, anodes and cathodes in a case of photodiodes. These electrode regions 103 may be, for example, doped regions in the substrate 101, such as p-type doped regions or n-type doped regions.

On the side of the first substrate surface 101-1S of the substrate 101, electrodes 107 may be formed to lead the electrode regions 103 of the opto-electronic device to the outside for proper electrical connection. According to the semiconductor manufacturing process, a metallization may be formed on the side of the first substrate surface 101-1S, and the electrodes 107 may be included in such a metallization. For example, the metallization may comprise one or more interlayer dielectric layers 105, in which through holes or trenches may be formed and conductive material, such as metal, may be filled to form conductive channels. These conductive channels may include vias and/or metallic interconnections. For example, the metallization may be formed via the Damascus process. These conductive channels may constitute the electrodes 107, and the electrodes 107 may be electrically connected to corresponding electrode regions 103. According to the embodiment of the present disclosure, the electrodes 107 may include Au or Ti.

In addition, when forming the metallization, some conductive material 109 may remain between the electrodes 107 (but is separated from the electrodes 107 to avoid unnecessary electrical connection). The remaining conductive material 109 may be formed in the same process as the electrodes 107, so that their upper surfaces may be substantially coplanar. The conductive material 109 facilitates maintaining a distance between the opto-electronic chip 100 and the packaging base during subsequent bonding, thereby contributing to enhanced mechanical strength.

In this example, the opto-electronic chip 100 may be of back type, i.e., an incident light may be incident from the side of the second substrate surface 101-2S. In this way, various components formed on the side of the first substrate surface 101-1S, such as electrodes and the like, will not affect the incidence of light.

Figure 2:
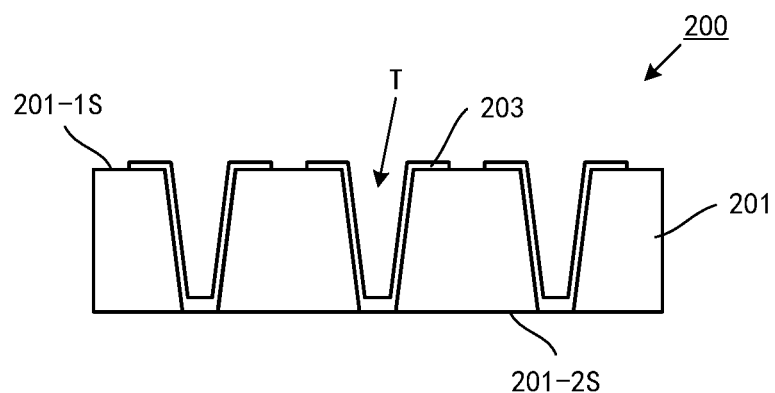
FIG. 2 is a schematic cross-sectional diagram of a packaging base according to an embodiment of the present disclosure.

FIG. 2 is a schematic cross-sectional diagram of a packaging base according to an embodiment of the present disclosure.

As shown in FIG. 2, the packaging base 200 according to the present embodiment may include an insulating base such as a glass base, a ceramic base, or the like. A thermal expansion coefficient of the packaging base 200 may be substantially the same as that of the substrate 101 in order to ensure reliability, particularly in response to a temperature variation. For example, in a case that the substrate 101 is a silicon substrate, the packaging base 200 may include borosilicate glass. In this way, the possibility of cracking between the chip 100 and the packaging base 200 upon temperature variation can be reduced.

The packaging base 200 may have a first base surface 201-1S and a second base surface 201-2S opposite to each other. The first base surface 201-1S and the second base surface 201-2S may be substantially parallel to each other. In the packaging base 200, conductive channels 203 extending from the first base surface 201-1S to the second base surface 201-2S may be formed. For example, through holes T extending from the first base surface 201-1S to the second base surface 201-2S through the packaging base 200 may be formed and conductive material, such as metal, may be filled in the through holes T to form the conductive channels 203. According to the embodiment of the present disclosure, the conductive channels 203 may include AuPbTi or AuTi. In the example of FIG. 2, the conductive material is formed on the bottom and side walls of the through holes T. However, the present disclosure is not limited thereto, for example, the conductive material may be fully filled in the through holes T.

In the techniques of the present disclosure, the packaging base 200 will be stacked on the opto-electronic chip 100 in such a manner that the second base surface 201-2S faces the opto-electronic chip 100. Thus, the side of the second base surface 201-2S may preferably be planar. That is, the bottom surface of the conductive channels 203 may be substantially coplanar with the second base surface 201-2S of the packaging base 200. In addition, on the side of the first base surface 201-1S, the conductive channels 203 may extend to the first base surface 201-1S for subsequent electrical connection, for example, to a circuit board.

The packaging base 200 may be a dedicated packaging base specifically designed for the opto-electronic chip 100. For example, a layout of the conductive channels 203 on the packaging base 200 may be substantially the same as a layout of the electrodes 107 on the opto-electronic chip 100. Thus, when the packaging base 200 is stacked with the opto-electronic chip 100, the conductive channels 203 may correspond to the electrodes 107 one by one and are opposite to each other.

Alternatively, the packaging base 200 may be a general packaging base. For example, an array of the conductive channels 203 may be formed on the packaging base 200 at a certain pitch. When the packaging base 200 is stacked with the opto-electronic chip 100, at least a part of the conductive channels 203 on the packaging base 200 may correspond to the electrodes 107 on the opto-electronic chip 100 and are opposite to each other. Of course, such a general packaging base 200 may also be used to arrange other chips other than the opto-electronic chip 100.

Figure 3:
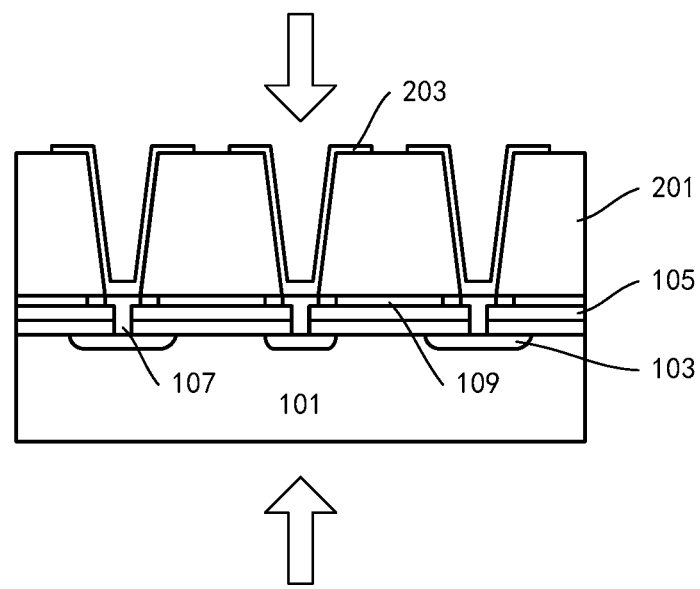
FIG. 3 is a diagram illustrating bonding of an opto-electronic chip and a packaging base according to an embodiment of the present disclosure.

FIG. 3 is a diagram illustrating bonding of the opto-electronic chip and the packaging base according to an embodiment of the present disclosure.

As shown in FIG. 3, in a bonder, the opto-electronic chip 100 may be stacked with the packaging base 200. Specifically, the side of the first substrate surface 101-1S of the opto-electronic 100 may face the side of the second base surface 201-2S of the packaging base 200. In addition, positions of the opto-electronic 100 and/or the packaging base 200 may be adjusted so that the electrodes 107 on the opto-electronic 100 may be aligned with corresponding conductive channels 203 on the packaging base 200.

Then, certain temperature (e.g., about 400-500° C.) and pressure (e.g., about 2000-4000 mBar) may be applied in the bonder so that the electrodes 107 and the conductive channels 203 may be bonded together (e.g. joined together due to melting of the metal material).

Figure 4:
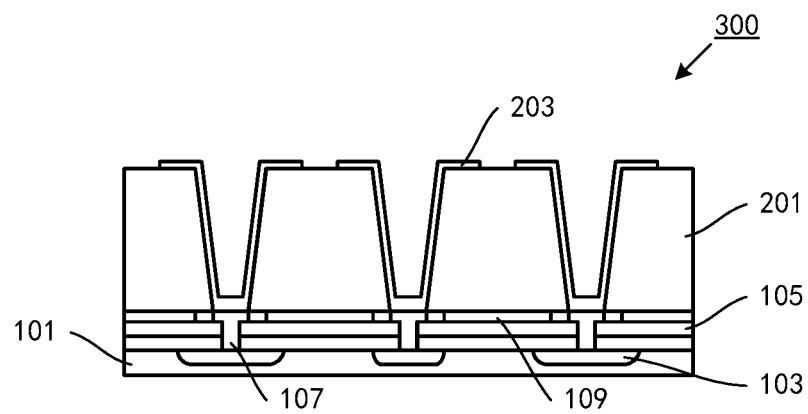
FIG. 4 is a schematic cross-sectional diagram of a packaging structure for an opto-electronic device according to an embodiment of the present disclosure.

According to the embodiment of the present disclosure, after the bonding, the opto-electronic chip may be thinned at the side of the second substrate surface 101-2S of the opto-electronic chip 100. For example, as shown in FIG. 4, the substrate 101 may be thinned. According to an example, the opto-electronic chip 100 may be thinned to about 140-200 μm by mechanical means. Then, the opto-electronic chip 100 may be thinned to about 50-140 μm by chemical or chemo-mechanical means. Such thinned thickness is beneficial for collection of photo-generated carriers and can effectively improve photo-electric transformation efficiency.

The packaging structure 300 according to the embodiment of the present disclosure can tolerate a higher temperature (up to about 400° C. or more), reduces the difficulty in subsequent welding, significantly improves the firmness (bonding strength), and largely improves the reliability of the device. In addition, there is no need to fill with the padding material subsequently.

The embodiments of the present disclosure have been described above. However, these embodiments are for illustrative purposes only and are not intended to limit the scope of the present disclosure. The scope of the present disclosure is defined by the appended claims and their equivalents. Various alternatives and modifications may be made by those skilled in the art without departing from the scope of the present disclosure, and such alternatives and modifications are intended to be within the scope of the present disclosure.

We claim:

1. A packaging structure for an opto-electronic device, comprising:
   an opto-electronic chip, comprising:
      a substrate having a first substrate surface and a second substrate surface opposite to each other;
      an opto-electronic device formed on the substrate; and
      electrodes for the opto-electronic device which are formed on the first substrate surface; and
   a packaging base having a first base surface and a second base surface opposite to each other, and comprising conductive channels extending from the first base surface to the second base surface,
   wherein the opto-electronic chip is stacked with the packaging base in such a manner that the first substrate surface faces the packaging base, and the electrodes formed on the first substrate surface of the opto-electronic chip are bonded with corresponding conductive channels in the packaging base, and
   wherein the electrodes are included in a metallization formed on the substrate.

2. The packaging structure according to claim 1, wherein the opto-electronic chip has a thickness of 50-140 μm.

3. The packaging structure according to claim 1, wherein the electrodes comprise Au or Ti.

4. The packaging structure according to claim 1, wherein a thermal expansion coefficient of the packaging base is substantially the same as that of the substrate.

5. The packaging structure according to claim 4, wherein the substrate comprises silicon, and the packaging base comprises borosilicate glass.

6. The packaging structure according to claim 1, wherein the conductive channels comprises AuPbTi or AuTi.

\* \* \* \* \*